(12) United States Patent
Chen

(10) Patent No.: US 11,908,539 B2
(45) Date of Patent: Feb. 20, 2024

(54) VOLTAGE REGULATOR FOR PROVIDING WORD LINE VOLTAGE

(71) Applicant: NANYA TECHNOLOGY CORPORATION, New Taipei (TW)

(72) Inventor: Chih-Jen Chen, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 136 days.

(21) Appl. No.: 17/829,350

(22) Filed: May 31, 2022

(65) Prior Publication Data

US 2023/0386524 A1 Nov. 30, 2023

(51) Int. Cl.
G11C 5/14 (2006.01)

(52) U.S. Cl.
CPC .............. *G11C 5/147* (2013.01); *G11C 5/145* (2013.01)

(58) Field of Classification Search
CPC ................................ G11C 5/147; G11C 5/145
See application file for complete search history.

(56) References Cited

U.S. PATENT DOCUMENTS

| | | | | |
|---|---|---|---|---|
| 6,005,819 A * | 12/1999 | Shin | ...................... | G11C 11/407 365/189.09 |
| 7,167,039 B2 | 1/2007 | Garrett, Jr. et al. | | |
| 7,733,126 B1 * | 6/2010 | Choy | .............. | H03K 19/018521 326/68 |
| 2006/0273847 A1 * | 12/2006 | Bracmard | ........ | G01R 31/31713 327/540 |
| 2015/0179247 A1 * | 6/2015 | Meinerzhagen | ...... | G11C 11/417 365/158 |
| 2021/0006156 A1 | 1/2021 | Low et al. | | |
| 2021/0104283 A1 * | 4/2021 | Chyan | ....................... | G06F 1/26 |
| 2023/0298653 A1 * | 9/2023 | Kim | .................... | G11C 11/4074 365/222 |

FOREIGN PATENT DOCUMENTS

| | | |
|---|---|---|
| CN | 110635682 | 12/2019 |
| CN | 114167929 | 3/2022 |
| WO | 2017168346 | 10/2017 |

OTHER PUBLICATIONS

"Office Action of Taiwan Counterpart Application", dated Nov. 10, 2023, p. 1-p. 8.

* cited by examiner

*Primary Examiner* — Min Huang
(74) *Attorney, Agent, or Firm* — JCIPRNET

(57) ABSTRACT

A voltage regulator for providing a word line voltage is provided. The voltage regulator includes a voltage divider, a comparator, a boost circuit and a bypass transistor. The voltage divider is coupled between the word line voltage and a low reference voltage. The voltage divider includes resistive elements connected in series at intermediate nodes. The comparator provides an enable signal according to a divided voltage value on a divided intermediate node among the intermediate nodes. The boost circuit boosts the word line voltage in response to the enable signal. A source terminal of the bypass transistor is connected to a first intermediate node among the intermediate nodes. A drain terminal of the bypass transistor is connected to a second intermediate node among the intermediate nodes. The bypass transistor is turned-off in response to the control signal having an intermediate voltage value on the first intermediate node.

15 Claims, 4 Drawing Sheets

VOLTAGE REGULATOR FOR PROVIDING WORD LINE VOLTAGE

BACKGROUND

Technical Field

The disclosure generally relates to a voltage regulator, and more particularly to a voltage regulator for providing a word line voltage.

Description of Related Art

FIG. 1 illustrates a schematic diagram of a voltage regulator according to a prior embodiment. The voltage regulator 10 provides a word line voltage VCCP for a memory device (for example, dynamic random access memory (DRAM) device). The voltage regulator 10 includes a voltage divider VD and a boost circuit BC. The voltage divider VD includes resistors R1 to R4 connected in in series at intermediate nodes ND1, ND2 and ND3. The voltage divider VD divides the word line voltage VCCP to generate a divided voltage V3 on the intermediate node ND3. A voltage value of the divided voltage V3 is associated with a voltage value of the word line voltage VCCP. The boost circuit BC adjusts the word line voltage VCCP according to the divided voltage V3. Therefore, the voltage regulator 10 stables the voltage value of the word line voltage VCCP.

In order to avoid a risk about the word line voltage VCCP exceeding default device specification based on process variations, the voltage regulator 10 need a bypass transistor PT to adjust a resistance value between the intermediate nodes ND1, ND2. If the bypass transistor PT is turned-on by a low reference voltage VSS, resistors R2 is bypassed. If the bypass transistor PT is turned-off by the word line voltage VCCP, resistors R2 is not bypassed. Therefore, a adjusting margin about the voltage value of the word line voltage VCCP could be enlarged.

However, when the bypass transistor PT is turned-off, a gate induced drain leakage (GIDL) effect causes charge on the drain terminal of the bypass transistor PT flow to a bulk terminal of the bypass transistor PT. This GIDL effect raises a voltage value V2 on the intermediate node ND2. The voltage value of the divided voltage V3 also raises. Therefore, the boost circuit BC performs a misoperation based on the above abnormality of the voltage value of the divided voltage V3. The word line voltage VCCP would not be able to reach the device specification.

SUMMARY

The disclosure provides a voltage regulator for reducing a gate induced drain leakage (GIDL) effect of a bypass transistor.

The disclosure provides a voltage regulator for providing a word line voltage. The voltage regulator includes a voltage divider, a comparator, a boost circuit and a bypass transistor. The voltage divider is coupled between the word line voltage and a low reference voltage. The voltage divider includes a plurality of resistive elements connected in series on a plurality of intermediate nodes. The comparator is connected to a divided intermediate node among the plurality of intermediate nodes. The comparator provides an enable signal according to a divided voltage value on the divided intermediate node. The boost circuit is coupled to the comparator. The boost circuit boosts the word line voltage in response to the enable signal. A source terminal of the bypass transistor is connected to a first intermediate node among the plurality of intermediate nodes. A drain terminal of the bypass transistor is connected to a second intermediate node among the plurality of intermediate nodes. A gate terminal of the bypass transistor receives a control signal. The bypass transistor is turned-off in response to the control signal having an intermediate voltage value on the first intermediate node.

Based on the above description, the bypass transistor is turned-off in response to the control signal having an intermediate voltage value on the first intermediate node. The intermediate voltage value is lower than a voltage value of the word line voltage. Therefore, the GIDL effect of the bypass transistor could be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
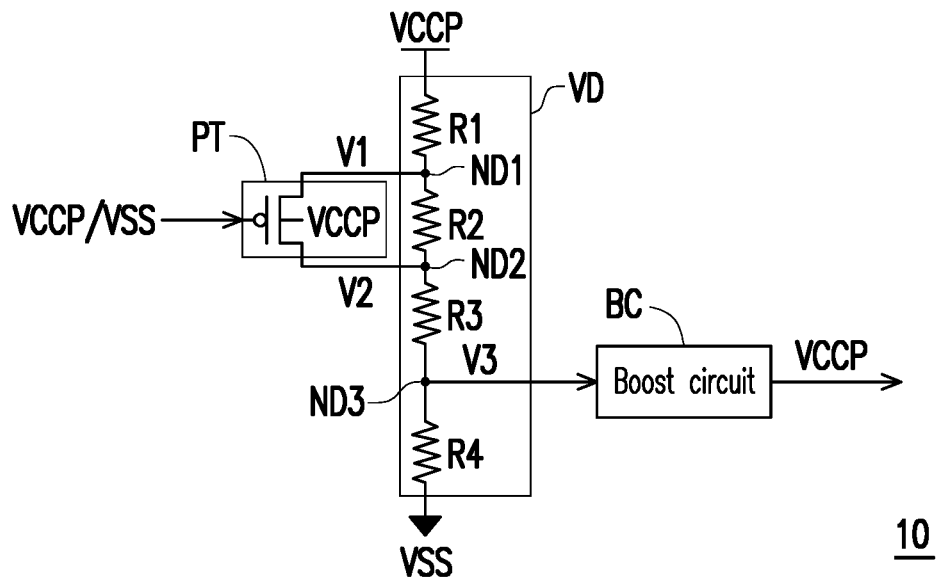
FIG. 1 illustrates a schematic diagram of a voltage regulator according to a prior embodiment.
Figure 2:
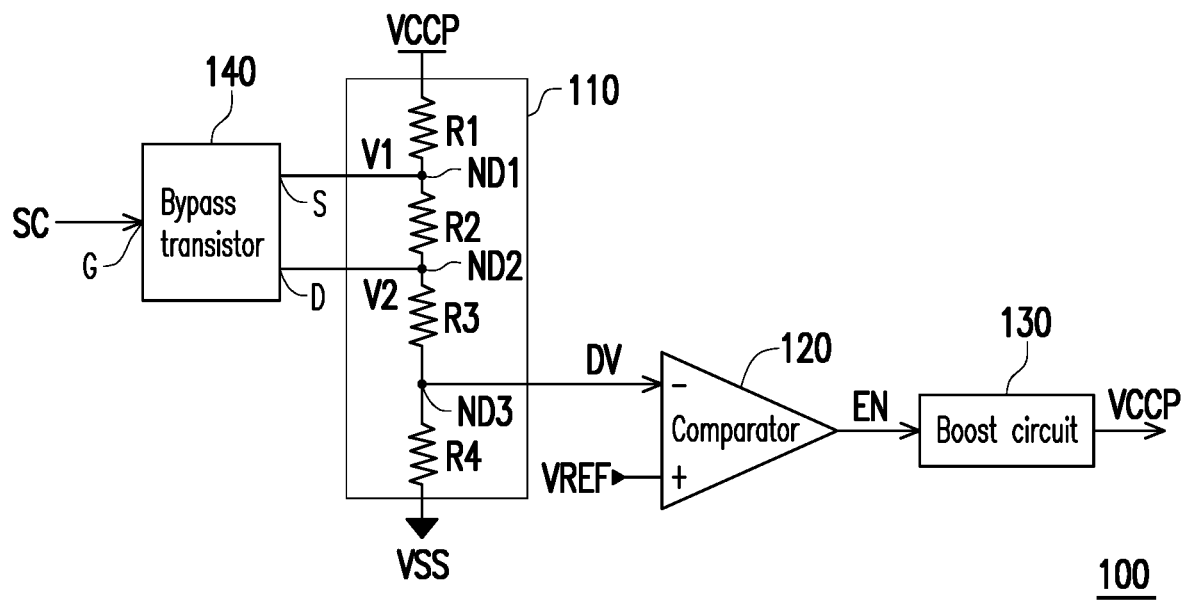
FIG. 2 illustrates a schematic diagram of a voltage regulator according to a first embodiment of the disclosure.

FIG. 2 illustrates a schematic diagram of a voltage regulator according to a first embodiment of the disclosure. Referring to FIG. 2, the voltage regulator 100 is used to provide a word line voltage VCCP. The word line voltage VCCP may be used for a memory device. For example, the word line voltage VCCP is used for dynamic random access memory (DRAM) device. In the embodiment, the voltage regulator 100 includes a voltage divider 110, a comparator 120, a boost circuit 130 and a bypass transistor 140. The voltage divider 110 is coupled between the word line voltage VCCP and a low reference voltage VSS. The voltage divider 110 includes resistive elements R1, R2, R3 and R4. The resistive elements R1, R2, R3 and R4 are connected in series on intermediate nodes ND1, ND2 and ND3. In the embodiment, the resistive element R1 is connected between the word line voltage VCCP and the intermediate nodes ND1. The resistive element R2 is connected between the intermediate nodes ND1 and ND2. The resistive element R3 is connected between the intermediate nodes ND2 and ND3. The resistive element R4 is connected between the intermediate node ND3 and the low reference voltage VSS. The voltage divider 110 divides a voltage value of the word line voltage VCCP to generate a divided voltage value DV on a divided intermediate node. The divided intermediate node is the intermediate node ND3.

In the embodiment, the comparator 120 is connected to the intermediate node ND3. The comparator 120 provides an enable signal EN according to a divided voltage value DV on the intermediate node ND3. The boost circuit 130 is coupled to the comparator 120. The boost circuit 130 receives the enable signal EN from the comparator 120. The boost circuit 130 boosts the word line voltage VCCP in response to the enable signal EN.

In the embodiment, the comparator 120 compares the divided voltage value DV and a reference voltage value VREF, and decides a voltage value of the enable signal EN according to a comparing result between the divided voltage value DV and a reference voltage value VREF. For example, the divided voltage value DV is positive correlation with the voltage value of the word line voltage VCCP. The comparator 120 may provide the enable signal EN having a high voltage value when the divided voltage value DV is lower than the reference voltage value VREF. This comparing result indicates the voltage value of the word line voltage VCCP is lower than a default voltage value. Therefore, the boost circuit 130 boosts the word line voltage VCCP in response to the enable signal EN having the high voltage value. The comparator 120 may provide the enable signal EN having a low voltage value when the divided voltage value DV is higher than or equal to the reference voltage value VREF. This comparing result indicates the voltage value of the word line voltage VCCP is enough. Therefore, the boost circuit 130 stops boosting the word line voltage VCCP in response to the enable signal EN having the low voltage value.

In the embodiment, the bypass transistor 140 may be a PMOS transistor. A source terminal S of the bypass transistor 140 is connected to the intermediate node ND1. A drain terminal D of the bypass transistor 140 is connected to the intermediate node ND2. A gate terminal G of the bypass transistor 140 receives a control signal SC. The bypass transistor 140 is turned-on in response to the control signal SC having a voltage value of the low reference voltage VSS. Therefore, the resistive element R2 is bypassed. The bypass transistor 140 is turned-off in response to the control signal SC having an intermediate voltage value V1 on the intermediate node ND1.

It should be noted, the bypass transistor 140 is turned-off by the intermediate voltage value V1. The intermediate voltage value V1 is lower than the voltage value of the word line voltage VCCP. Therefore, a gate induced drain leakage (GIDL) effect of the bypass transistor 140 could be reduced.

For example, the voltage value of the word line voltage VCCP is 3 V. The intermediate voltage value V1 on the intermediate node ND1 is 1 V. An intermediate voltage value V2 on the intermediate node ND2 is 0.8 V. A voltage difference between the intermediate voltage values V1 and V2 is 0.2 V. The voltage difference is much lower than voltage difference between the voltage value of the word line voltage VCCP and the intermediate voltage values V2 (2.2 V). Therefore, the GIDL effect of the bypass transistor 140 could be reduced. A charge on the drain terminal D of the bypass transistor 140 is not flow to a bulk terminal of the bypass transistor 140. Therefore, the intermediate voltage value V2 is not shifted by the GIDL effect when the bypass transistor 140 is turned-off.

In some embodiment, the source terminal S of the bypass transistor 140 is connected to the intermediate node ND2. The drain terminal D of the bypass transistor 140 is connected to the intermediate node ND3. The gate terminal G of the bypass transistor 140 receives a control signal SC. The bypass transistor 140 is turned-on in response to the control signal SC having a voltage value of the low reference voltage VSS. Therefore, the resistive element R3 is bypassed. The bypass transistor 140 is turned-off in response to the control signal SC having the intermediate voltage value V1 on the intermediate node ND1.

In the embodiment, an inverting terminal of the comparator 120 is connected to the intermediate node ND3. A non-inverting terminal of the comparator 120 is connected to the reference voltage value VREF. An output terminal of the comparator 120 is coupled to the boost circuit.

In the embodiment, each of the resistive elements R1, R2, R3 and R4 is an element providing a resistance value. Each of the resistive elements R1, R2, R3 and R4 may be implemented by a resistor or at least one transistor. Besides, in order to facilitate the description of the spirit of the disclosure, 4 resistive elements R1, R2, R3 and R4 are used as examples in the present embodiment. The disclosure is not limited to the number of the resistive elements in the present embodiment. The number of the resistive elements is higher than 2 in the disclosure.

Figure 3:
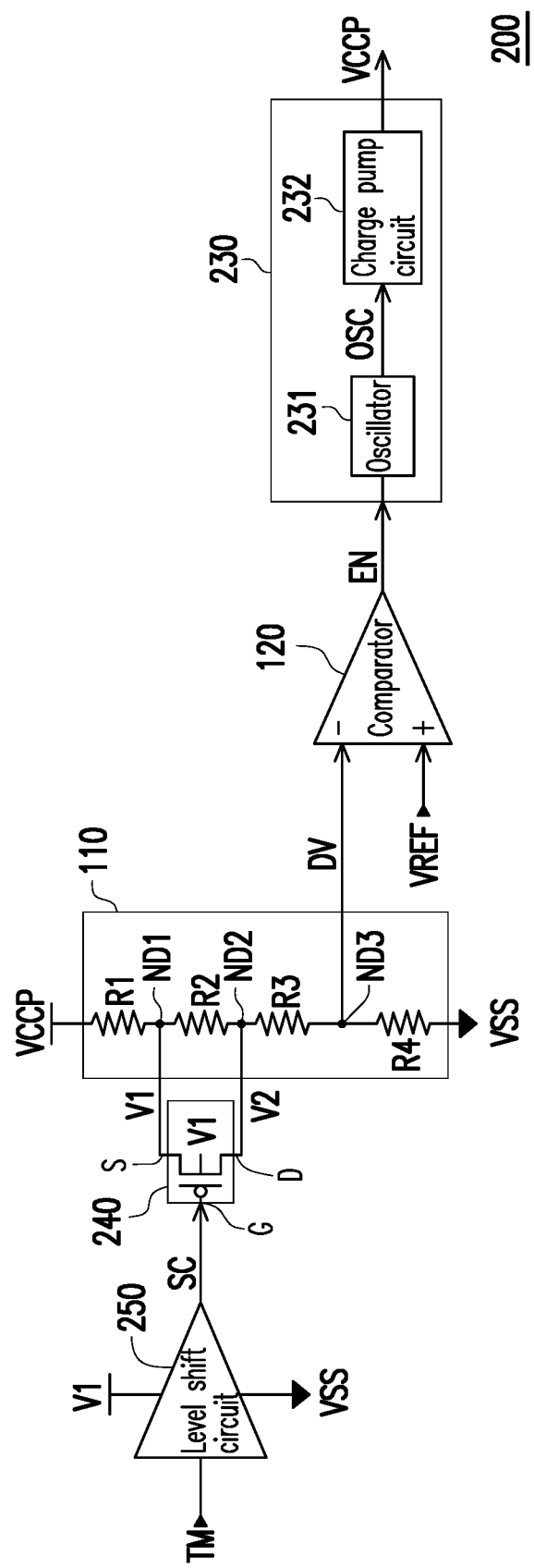
FIG. 3 illustrates a schematic diagram of a voltage regulator according to a second embodiment of the disclosure.

FIG. 3 illustrates a schematic diagram of a voltage regulator according to a second embodiment of the disclosure. Referring to FIG. 3, in the embodiment, the voltage regulator 200 includes the voltage divider 110, the comparator 120, a boost circuit 230 and a bypass transistor 240. The voltage divider 110 and the comparator 120 can be inferred by referring to the relevant description of the FIG. 2, which is not repeated hereinafter.

In the embodiment, the bypass transistor 240 is a PMOS transistor. The intermediate voltage value V1 on the first intermediate node ND1 is higher than the intermediate voltage value V2 on the second intermediate node ND2. A source terminal S of the bypass transistor 240 is connected to the intermediate node ND1. A drain terminal D of the bypass transistor 240 is connected to the intermediate node ND2. A gate terminal G of the bypass transistor 240 receives a control signal SC. The bypass transistor 240 is turned-on in response to the control signal SC having the voltage value of the low reference voltage VSS. Therefore, the resistive element R2 is bypassed. The bypass transistor 240 is turned-off in response to the control signal SC having the intermediate voltage value V1 on the intermediate node ND1.

Besides, in order to avoid a latch-up effect and body effect of the bypass transistor 240, the bulk terminal of the bypass transistor 240 receives the intermediate voltage value V1. In other words, the bulk terminal is connected to the intermediate node ND1.

In the embodiment, the boost circuit 230 includes an oscillator 231 and a charge pump circuit 232. The oscillator 231 is coupled to the comparator 120. The oscillator 231 generates an oscillating signal OSC in response to a default voltage value of the enable signal EN. The charge pump circuit 232 is coupled to the oscillator 231. The charge pump circuit 232 boosts the word line voltage VCCP in response to the oscillating signal OSC.

For example, the comparator 120 provides the enable signal EN having a high voltage value (that is, the default voltage value) when the divided voltage value DV is lower than the reference voltage value VREF. The oscillator 231 is enabled to generate the oscillating signal OSC in response to the enable signal EN having a high voltage value. The charge pump circuit 232 receives the oscillating signal OSC and boosts the word line voltage VCCP. Therefore, the voltage value of the word line voltage VCCP is raised by the charge pump circuit 232. In other hands, the comparator 120 provides the enable signal EN having a low voltage value when the divided voltage value DV is higher than or equal to the reference voltage value VREF. This comparing result indicates the voltage value of the word line voltage VCCP is enough. Therefore, the boost circuit 130 stops boosting the word line voltage VCCP in response to the enable signal EN having the low voltage value. The oscillator 231 is not enabled and stops generating the oscillating signal OSC. The charge pump circuit 232 is disabled. Therefore, the voltage value of the word line voltage VCCP is not raised.

In the embodiment, the voltage regulator 200 further includes a level shift circuit 250. The level shift circuit 250 is coupled to the gate terminal of the bypass transistor 240. The level shift circuit 250 generates the control signal SC having the intermediate voltage value V1 in response to a set signal TM having a first value, and generates the control signal SC having the voltage value of the low reference voltage VSS in response to the set signal TM having a second value. In the embodiment, a set terminal of the level shift circuit 250 is used to receive the set signal TM. A high reference terminal of the level shift circuit 250 receives the intermediate voltage value V1. A low reference terminal of the level shift circuit 250 receives the low reference voltage VSS. An output terminal of the level shift circuit 250 is used to output the control signal SC. In some embodiments, the high reference terminal of the level shift circuit 250 may be coupled to the intermediate node ND1.

The set signal TM is a digital code or signal a voltage. For example, the level shift circuit 250 generates the control signal SC having the intermediate voltage value V1 in response to the set signal TM having a value "1". Therefore, the bypass transistor 240 is turned-off. In other hands, the level shift circuit 250 generates the control signal SC having the voltage value of the low reference voltage VSS in response to the set signal TM having a value "0". Therefore, the bypass transistor 240 is turned-on, so as to bypass the resistive element R2.

Figure 4:
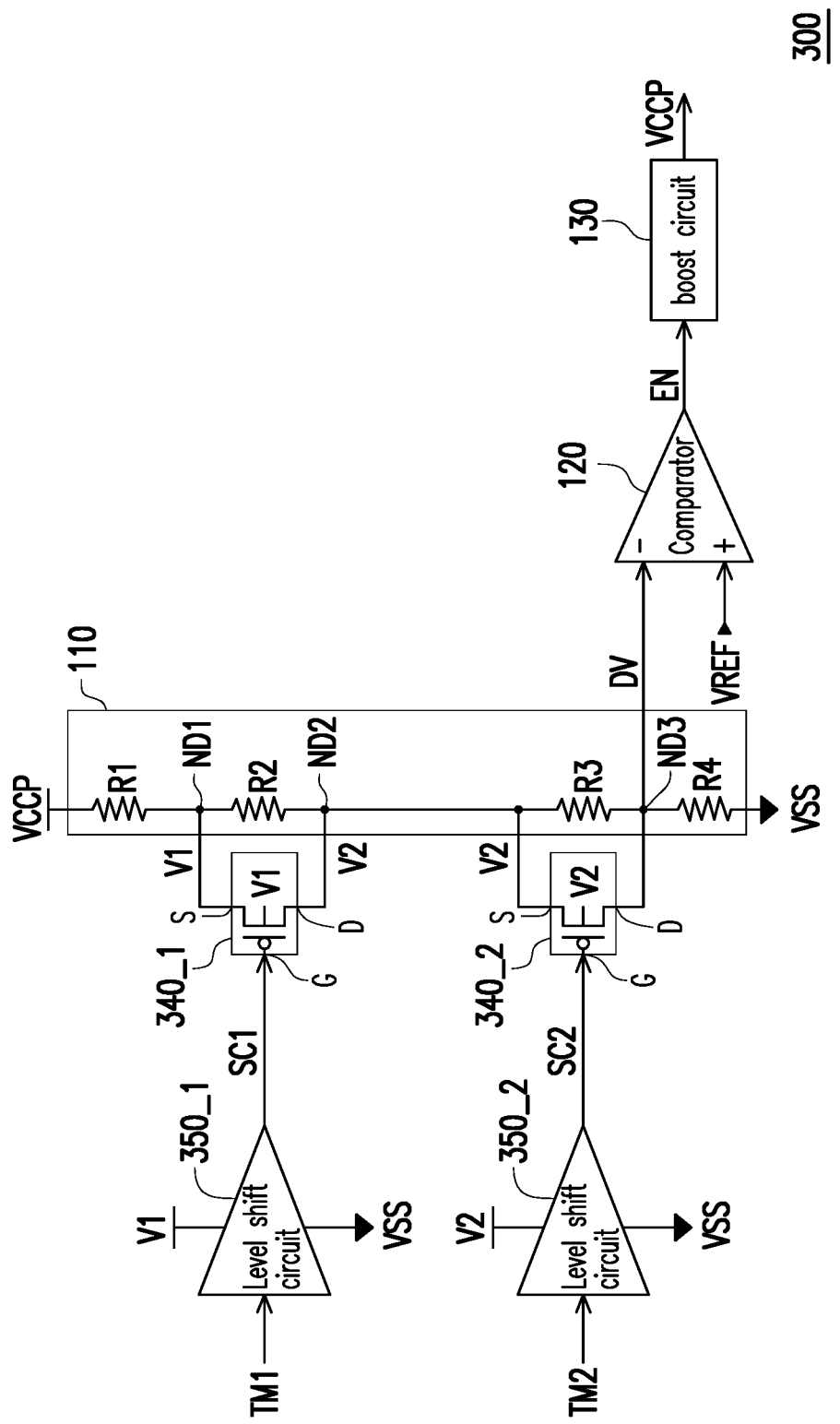
FIG. 4 illustrates a schematic diagram of a voltage regulator according to a third embodiment of the disclosure.

FIG. 4 illustrates a schematic diagram of a voltage regulator according to a third embodiment of the disclosure. Referring to FIG. 4, in the embodiment, the voltage regulator 300 includes the voltage divider 110, the comparator 120, the boost circuit 130, bypass transistors 340_1, 340_2 and level shift circuits 350_1, 350_2. The voltage divider 110, the comparator 120, the boost circuit 130 can be inferred by referring to the relevant description of the FIG. 2 and FIG. 3, which is not repeated hereinafter.

In the embodiment, each of the bypass transistors 340_1 and 340_2 is a PMOS transistor. The intermediate voltage value V1 is higher than an intermediate voltage value V2. The intermediate voltage value V2 is higher than an intermediate voltage value V3 on the second intermediate node ND3. A source terminal S of the bypass transistor 340_1 is connected to the intermediate node ND1. A drain terminal D of the bypass transistor 340_1 is connected to the intermediate node ND2. A gate terminal G of the bypass transistor 340_1 receives a control signal SC1. The bypass transistor 340_1 is turned-on in response to the control signal SC1 having the voltage value of the low reference voltage VSS. Therefore, the resistive element R2 is bypassed. The bypass transistor 340_1 is turned-off in response to the control signal SC1 having the intermediate voltage value V1 on the intermediate node ND1. A source terminal S of the bypass transistor 340_2 is connected to the intermediate node ND2. A drain terminal D of the bypass transistor 340_2 is connected to the intermediate node ND3. A gate terminal G of the bypass transistor 340_2 receives a control signal SC2. The bypass transistor 340_2 is turned-on in response to the control signal SC2 having the voltage value of the low reference voltage VSS. Therefore, the resistive element R3 is bypassed. The bypass transistor 340_2 is turned-off in response to the control signal SC2 having the intermediate voltage value V2 on the intermediate node ND2.

Besides, a bulk terminal of the bypass transistor 340_1 receives the intermediate voltage value V1. In other words, the bulk terminal of the bypass transistor 340_1 is connected to the intermediate node ND1. A bulk terminal of the bypass transistor 340_2 receives the intermediate voltage value V2. In other words, the bulk terminal of the bypass transistor 340_2 is connected to the intermediate node ND2.

In the embodiment, for example, the level shift circuit 350_1 generates the control signal SC1 having the intermediate voltage value V1 in response to a set signal TM1 having the value "1", and generates the control signal SC1 having the voltage value of the low reference voltage VSS in response to the set signal TM1 having the value "0". In the embodiment, a set terminal of the level shift circuit 350_1 is used to receive the set signal TM1. A high reference terminal of the level shift circuit 350_1 receives the intermediate voltage value V1. A low reference terminal of the level shift circuit 350_1 receives the low reference voltage VSS. An output terminal of the level shift circuit 350_1 is used to output the control signal SC1.

The level shift circuit 350_2 generates the control signal SC2 having the intermediate voltage value V2 in response to a set signal TM2 having the value "1", and generates the control signal SC2 having the voltage value of the low reference voltage VSS in response to the set signal TM2 having the value "0". In the embodiment, a set terminal of the level shift circuit 350_2 is used to receive the set signal TM2. A high reference terminal of the level shift circuit 350_2 receives the intermediate voltage value V2. A low reference terminal of the level shift circuit 350_2 receives the low reference voltage VSS. An output terminal of the level shift circuit 350_2 is used to output the control signal SC2.

In the embodiment, the set signals TM1 and TM2 may be decided during a test time for voltage regulator 300. The set signals TM1 and TM2 may be saved in a fuse storage.

Figure 5:
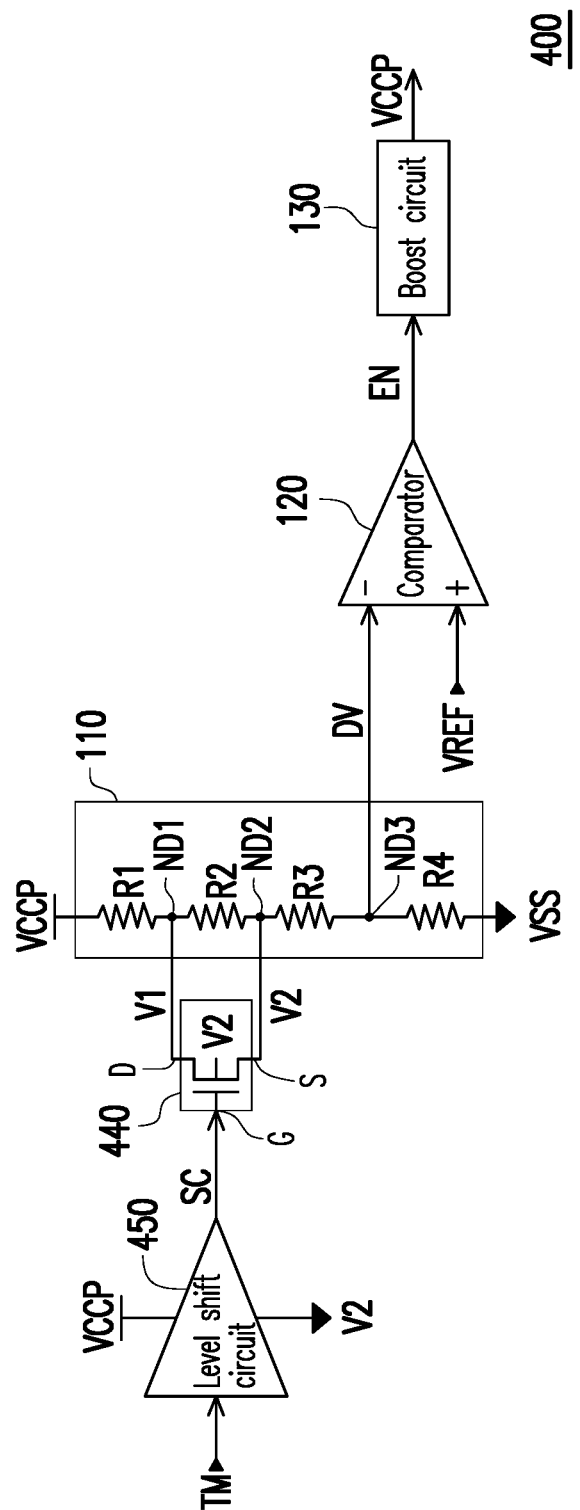
FIG. 5 illustrates a schematic diagram of a voltage regulator according to a fourth embodiment of the disclosure.

FIG. 5 illustrates a schematic diagram of a voltage regulator according to a fourth embodiment of the disclosure. Referring to FIG. 5, in the embodiment, the voltage regulator 400 includes the voltage divider 110, the comparator 120, the boost circuit 130, a bypass transistor 440 and a level shift circuit 450. The voltage divider 110, the comparator 120 the boost circuit 130 can be inferred by referring to the relevant description of the FIG. 2, which is not repeated hereinafter.

In the embodiment, the bypass transistor 440 is a NMOS transistor. A source terminal S of the bypass transistor 440 is connected to the intermediate node ND2. A drain terminal D of the bypass transistor 440 is connected to the intermediate node ND1. The intermediate voltage value V2 on the intermediate node ND2 is lower than the intermediate voltage value V1 on the intermediate node ND1. A gate terminal G of the bypass transistor 440 receives a control signal SC. The bypass transistor 440 is turned-on in response to the control signal SC having the voltage value of the word line voltage VCCP. Therefore, the resistive element R2 is bypassed. The bypass transistor 440 is turned-off in response to the control signal SC having the intermediate voltage value V2 on the intermediate node ND2.

Besides, a bulk terminal of the bypass transistor 440 receives the intermediate voltage value V2. In other words, the bulk terminal is connected to the intermediate node ND2.

For example, the voltage value of the low reference voltage VSS is 0 V. The intermediate voltage value V1 on the intermediate node ND1 is 2 V. An intermediate voltage value V2 on the intermediate node ND2 is 1.8 V. A voltage difference between the intermediate voltage values V1 and V2 is 0.2 V. The voltage difference is much lower than voltage difference between the voltage value of the low reference voltage VSS and the intermediate voltage values V1 (2 V). Therefore, the GIDL effect of the bypass transistor 140 could be reduced. A charge on the drain terminal D of the bypass transistor 140 is not flow to the bulk terminal B of the bypass transistor 140. Therefore, the intermediate voltage value V1 is not shifted by the GIDL effect when the bypass transistor 140 is turned-off.

In the embodiment, the level shift circuit 450 is coupled to the gate terminal of the bypass transistor 440. The level shift circuit 450 generates the control signal SC having the voltage value of the word line voltage VCCP in response to a set signal TM having a first value, and generates the control signal SC having the intermediate voltage value V2 in response to the set signal TM having a second value. In the embodiment, a set terminal of the level shift circuit 450 is used to receive the set signal TM. A high reference terminal of the level shift circuit 450 receives the word line voltage VCCP. A low reference terminal of the level shift circuit 450 receives the intermediate voltage value V2. An output terminal of the level shift circuit 450 is used to output the control signal SC. In some embodiments, the low reference terminal of the level shift circuit 450 may be coupled to the intermediate node ND2.

For example, the level shift circuit 450 generates the control signal SC having the intermediate voltage value V2 in response to the set signal TM having a value "1". Therefore, the bypass transistor 440 is turned-off. In other hands, the level shift circuit 450 generates the control signal SC having the voltage value of the word line voltage VCCP in response to the set signal TM having a value "0". Therefore, the bypass transistor 440 is turned-on, so as to bypass the resistive element R2.

In some embodiments, the resistive element R3 may be bypassed by another bypass transistor.

In view of the foregoing, the bypass transistor of the voltage regulator is turned-off in response to the control signal having an intermediate voltage value on the first intermediate node. The intermediate voltage value is lower than a voltage value of the word line voltage. Therefore, the GIDL effect of the bypass transistor could be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A voltage regulator for providing a word line voltage, comprising:
   a voltage divider, coupled between the word line voltage and a low reference voltage, comprising a plurality of resistive elements connected in series on a plurality of intermediate nodes;
   a comparator, connected to a divided intermediate node among the plurality of intermediate nodes, configured to provide an enable signal according to a divided voltage value on the divided intermediate node;
   a boost circuit, coupled to the comparator, configured to boost the word line voltage in response to the enable signal; and
   a bypass transistor, wherein a source terminal of the bypass transistor is connected to a first intermediate node among the plurality of intermediate nodes, a drain terminal of the bypass transistor is connected to a second intermediate node among the plurality of intermediate nodes, and a gate terminal of the bypass transistor receives a control signal,
   wherein the bypass transistor is turned-off in response to the control signal having an intermediate voltage value on the first intermediate node.

2. The voltage regulator of claim 1, wherein the bypass transistor is a PMOS transistor.

3. The voltage regulator of claim 2, wherein the intermediate voltage value on the first intermediate node is higher than an intermediate voltage value on the second intermediate node.

4. The voltage regulator of claim 2, wherein the bypass transistor is turned-on in response to the control signal having a voltage value of the low reference voltage, so as to bypass at least one resistive element between the first intermediate node and the second intermediate node.

5. The voltage regulator of claim 4, further comprising:
   a level shift circuit, coupled to the gate terminal of the bypass transistor, configured to generate the control signal having the intermediate voltage value in response to a set signal having a first value, and generate the control signal having the voltage value of the low reference voltage in response to the set signal having a second value.

6. The voltage regulator of claim 5, wherein a set terminal of the level shift circuit receives the set signal, a high reference terminal of the level shift circuit receives the intermediate voltage value, a low reference terminal of the level shift circuit receives the low reference voltage, and an output terminal of the level shift circuit outputs the control signal.

7. The voltage regulator of claim 1, wherein the bypass transistor is a NMOS transistor.

8. The voltage regulator of claim 7, wherein the intermediate voltage value on the first intermediate node is lower than an intermediate voltage value on the second intermediate node.

9. The voltage regulator of claim 7, wherein the bypass transistor is turned-on in response to the control signal having a voltage value of the word line voltage, so as to bypass at least one resistive element between the first intermediate node and the second intermediate node.

10. The voltage regulator of claim 9, further comprising:
a level shift circuit, coupled to the gate terminal of the bypass transistor, configurated to generate the control signal having the intermediate voltage value in response to a set signal having a first value, and generate the control signal having the voltage value of the word line voltage in response to the set signal having a second value.

11. The voltage regulator of claim 10, wherein a set terminal of the level shift circuit receives the set signal, a high reference terminal of the level shift circuit receives the word line voltage, a low reference terminal of the level shift circuit receives the intermediate voltage value, and an output terminal of the level shift circuit outputs the control signal.

12. The voltage regulator of claim 1, wherein the comparator compares the divided voltage value and a reference voltage value, and decides a voltage value of the enable signal according to a comparing result between the divided voltage value and a reference voltage value.

13. The voltage regulator of claim 12, wherein the comparator provides the enable signal having a high voltage value when the divided voltage value is lower than the reference voltage value, and provides the enable signal having a low voltage value when the divided voltage value is higher than or equal to the reference voltage value.

14. The voltage regulator of claim 12, wherein an inverting terminal of the comparator is connected to the divided intermediate node, a non-inverting terminal of the comparator is connected to the reference voltage value, and an output terminal of the comparator is coupled to the boost circuit.

15. The voltage regulator of claim 1, wherein the boost circuit comprises:
an oscillator, coupled to the comparator, configured to generate an oscillating signal in response to a default voltage value of the enable signal; and
a charge pump circuit, coupled to the oscillator, configured to boost the word line voltage in response to the oscillating signal.

* * * * *